(12) United States Patent
Lauga

(10) Patent No.: US 7,134,058 B2
(45) Date of Patent: Nov. 7, 2006

(54) MEMORY CIRCUIT SCAN ARRANGEMENT

(75) Inventor: Christophe Lauga, Westbury Park (GB)

(73) Assignee: STMicroelectronics Limited, Buckinghamshire (GB)

( * ) Notice: Subject to any disclaimer, the term of this patent is extended or adjusted under 35 U.S.C. 154(b) by 173 days.

(21) Appl. No.: 09/954,638

(22) Filed: Sep. 14, 2001

(65) Prior Publication Data

US 2003/0056161 A1    Mar. 20, 2003

(51) Int. Cl.
G11C 29/00    (2006.01)

(52) U.S. Cl. .................................................... 714/718
(58) Field of Classification Search ............... 714/718, 714/724, 726, 727, 729, 733, 734
See application file for complete search history.

(56) References Cited

U.S. PATENT DOCUMENTS 4,481,627 A * 11/1984 Beauchesne et al. ........ 714/718
5,557,619 A * 9/1996 Rapoport .................... 714/733
6,094,736 A * 7/2000 Komoike .................... 714/726
6,148,426 A * 11/2000 Kim et al. .................. 714/733
6,263,461 B1 * 7/2001 Ayres et al. ................ 714/718

* cited by examiner

Primary Examiner—James C. Kerveros
(74) Attorney, Agent, or Firm—Lisa K. Jorgenson; Dennis M. de Guzman; Seed IP Law Group PLLC

(57) ABSTRACT

A semiconductor integrated circuit comprises a plurality of combinational logic components, a memory and a testing arrangement for configuring the memory prior to testing the combinational logic components using one or more scan chains. The arrangement includes a bit pattern generator for generating a predetermined bit pattern for writing to the memory, a switching arrangement for selectively switching the memory input to receive data from the combinational logic components or from the data generator. The switching arrangement and data generator are arranged to input the predetermined bit pattern to the memory prior to testing the integrated circuit.

24 Claims, 9 Drawing Sheets

| | | | | | | | | |
|---|---|---|---|---|---|---|---|---|
| address=000 | 0 | 0 | 0 | 0 | 0 | 0 | 0 | 0 |
| address=001 | 0 | 1 | 0 | 0 | 1 | 0 | 0 | 1 |
| address=010 | 1 | 0 | 0 | 1 | 0 | 0 | 1 | 0 |
| address=011 | 1 | 1 | 0 | 1 | 1 | 0 | 1 | 1 |
| address=100 | 0 | 0 | 1 | 0 | 0 | 1 | 0 | 0 |
| address=101 | 0 | 1 | 1 | 0 | 1 | 1 | 0 | 1 |
| address=110 | 1 | 0 | 1 | 1 | 0 | 1 | 1 | 0 |
| address=111 | 1 | 1 | 1 | 1 | 1 | 1 | 1 | 1 |
| | data bit 7 | data bit 6 | data bit 5 | data bit 4 | data bit 3 | data bit 2 | data bit 1 | data bit 0 |

MEMORY CIRCUIT SCAN ARRANGEMENT

BACKGROUND OF THE INVENTION

1. Field of the Invention

The present invention relates to a full scan arrangement for testing digital circuits, in particular testing using scan chains with memory circuits.

2. Description of the Related Art

The testing of digital circuits using scan chains is well-known to those skilled in the art. In brief, a scan chain is a series of linked flip-flops which are arranged through areas of combinatorial logic on an integrated digital circuit. Each flip-flop receives an input from the previous flip-flop in the chain, and from the combinatorial logic through which the chain passes. At an input pin, a test pattern of logic 1's and 0's is input to the scan chain, and passes through the sequence of flip-flops and combinatorial logic to an output pin. The output sequence of logic 1's and 0's is changed from the input sequence by operation of the logic under test. The manner in which the sequence is changed is not important to determining whether the circuit is functioning correctly. The circuit can be determined to pass or fail the test by simply comparing the output sequence with the output sequence of a correctly functioning circuit.

To facilitate scanning, it is known to use software for automatic generation of the test sequences of logic 1's and 0's, known as test patterns, and to perform analysis. Such tools are known as Automatic Test Pattern Generation (ATPG) tools and are integral to full scan testing. A known example is Tetramax™ of Synopsys, Inc. Whilst this tool facilitates testing, on large chips the testing task is significant. On recent graphics chips designs there can be 170 scan chains with 2,600 flip-flops each. This results in excessive vector count and/or low test coverage.

We have appreciated the difficulty in testing integrated semiconductor circuits which contain one or more memory components.

BRIEF SUMMARY OF THE INVENTION

The invention is defined in the independent claims to which reference is directed. Preferred features are set out in the dependent claims.

In a method aspect of an embodiment of the invention described, a memory within an integrated circuit to be tested is loaded with a known bit sequence prior to testing. The memory thus configured provides a known output for a given input and can be modeled by combinational logic. In effect, the memory is rendered predictable so that its terminals and the surrounding circuitry can be tested.

In an apparatus aspect of the embodiment, circuitry providing an interface for a circuit to be tested is provided, known as a "wrapper". The wrapper circuit includes a preloader which is a circuit arranged to generate and provide a known bit sequence to write to the memory within the circuit to be tested.

BRIEF DESCRIPTION OF THE SEVERAL VIEWS OF THE DRAWINGS

An embodiment of the invention will now be described, by way of example only, with reference to the accompanying figures, in which.

DETAILED DESCRIPTION OF THE INVENTION

Figure 1:
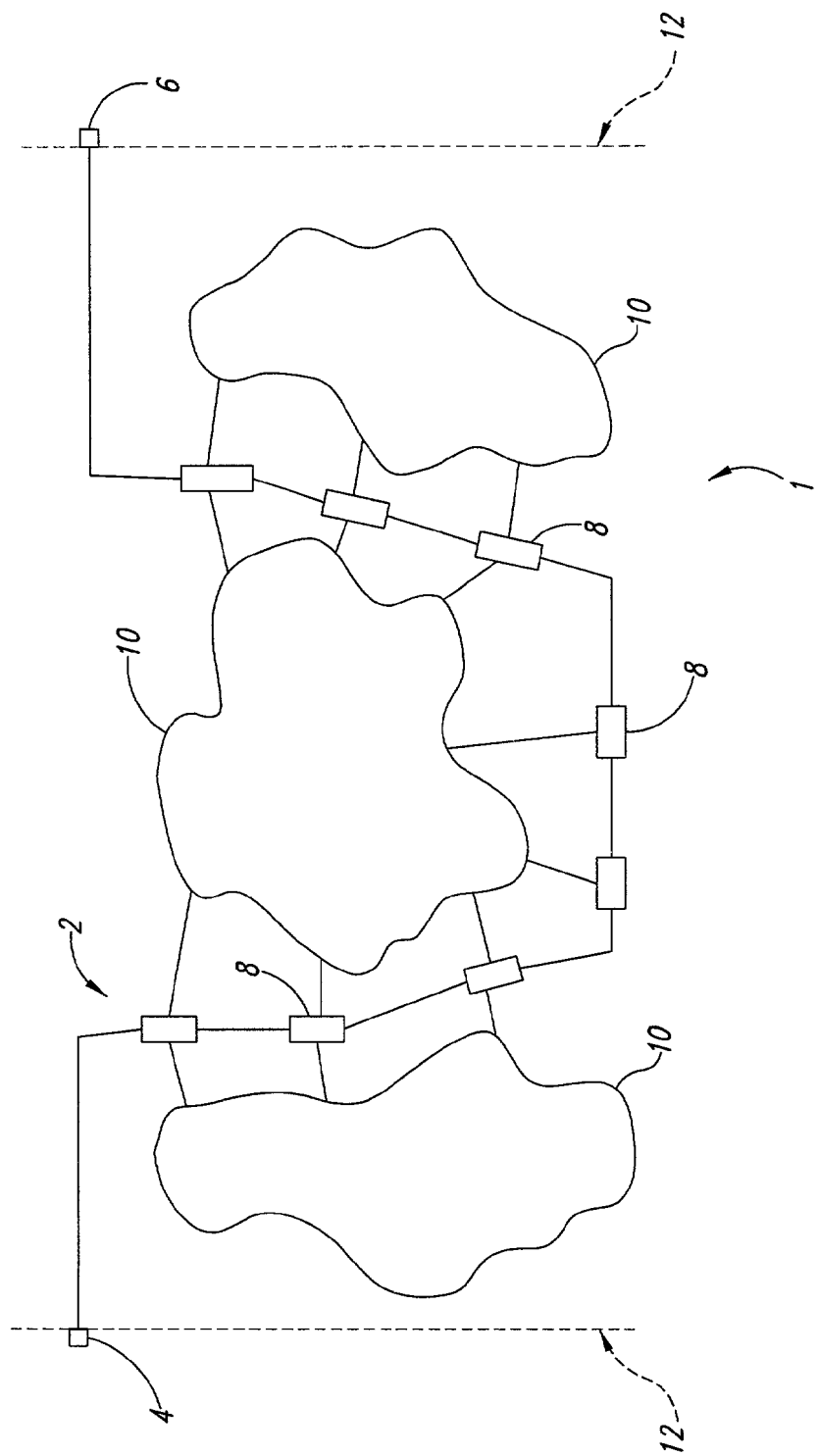
FIG. 1 shows a scan chain within an integrated circuit.

The embodiment described comprises an arrangement of scan chains and outputs for testing a digital integrated circuit, and also a digital integrated circuit including the scan chain arrangement in which a memory is configured with a known pattern prior to testing. A schematic view of a scan chain is shown in FIG. 1 by way of background.

A scan chain 2 comprises a sequence of latches or flip-flops 8 arranged serially between an input pin 4 and an output pin 6. Each flip-flop 8 provides the input to the logic blocks 10 and to the next flip-flop in the chain, and also receives signals from the circuitry logic under test. The circuit logic is shown as logic blocks 10 and can be any logic on a chip, such as a graphics controller. In practice, the logic cloud will comprise millions of components as an integrated circuit chip. Similarly, there will be hundreds of scan chains, each comprising thousands of flip-flops, with an input and an output pin for each chain. The chip 1 as a whole is manufactured with the scan chains built in for testing purposes and presents the input pin 4 and output pin 6 at the chip boundary 12.

Figure 2:
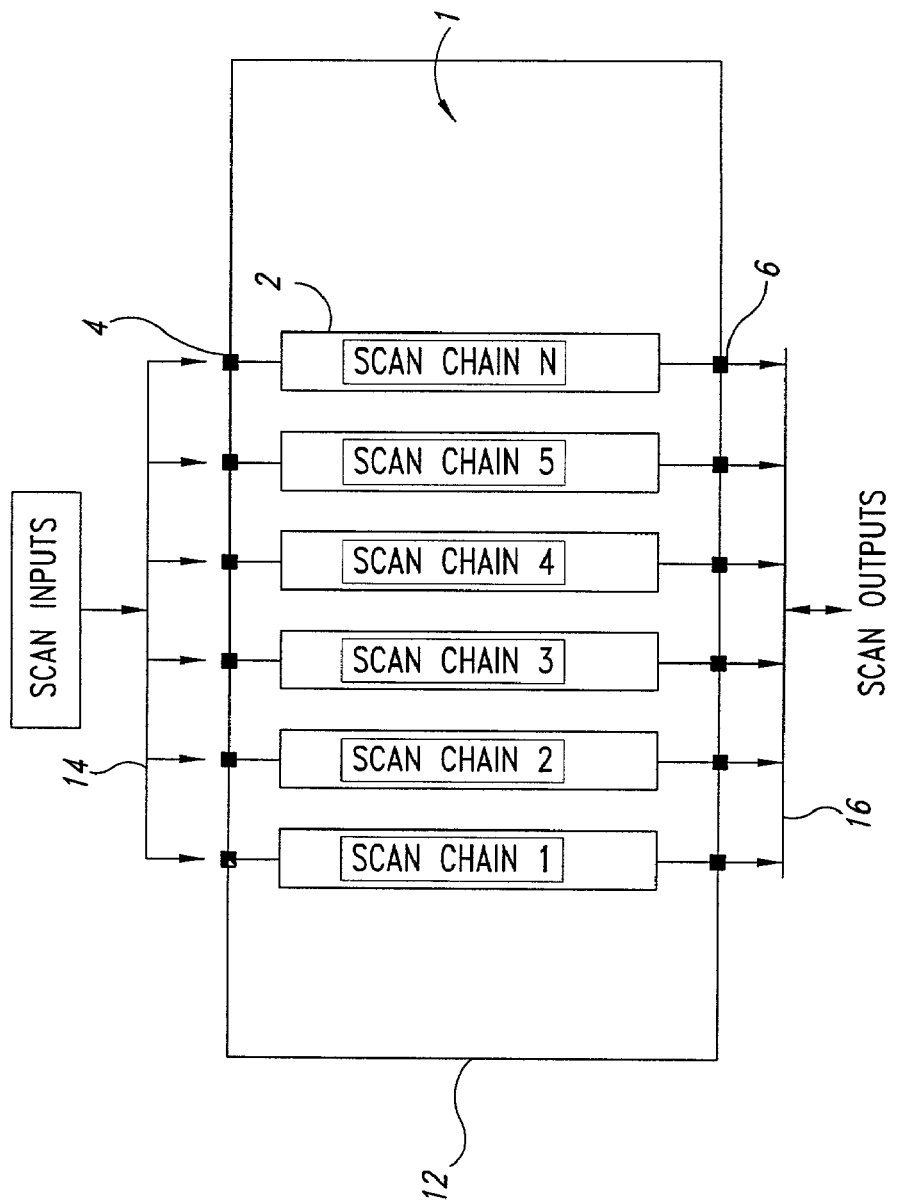
FIG. 2 shows conventional scan chain inputs and outputs.

A conventional scan chain arrangement is shown in FIG. 2. As shown, a series of scan chains 2 are provided which pass through a logic circuit 1 under test (with many discrete logic components, not shown) between input pin 4 and output pin 6 for input signals 14 and output signals 16. The pins are located at the chip interface boundary 12 and can be bonding pads, contact points, probe sites, testing terminals, internal circuit connection points, I/O ports, or any other structure that permits transfer of signals for input to and output from the circuits, all of which are included within the meaning of the term pin as used herein. To test the circuit 1 a series of logic bits of 1's and 0's is input at each input pin 4 to one of the respective scan chains 1 to N. The series of bits is known as a test pattern, and is typically provided by an Automatic Test Pattern Generator (ATPG) as previously described. The output from each output pin will be a pattern of 1's and 0's produced as a result of the interaction of the test pattern with the logic of the chip 1. A known correctly functioning chip will produce a given response to a given test pattern at each output pin 6. If there is a defect within the chip, this will be shown up as a difference in one or more of the output sequences. The location of the defect can then be derived, to an extent, from the position of the difference occurring in the test output patterns, and from which scan chains show differences from the expected output. This arrangement is valuable in both determining whether the chip passes the test and, if not, the approximate location of the defect.

The known scan chain arrangement described is well-known and can use existing ATPG tools such as those of Synopsys, Inc. previously mentioned, and is easy to debug in the sense that defects in the chips tested can be located by determining the scan chain (or chains) closest to where the error occurs. However, we have appreciated problems in using this technique when testing circuits which contain one or more memory elements; as shown in FIG. 3.

Figure 3:
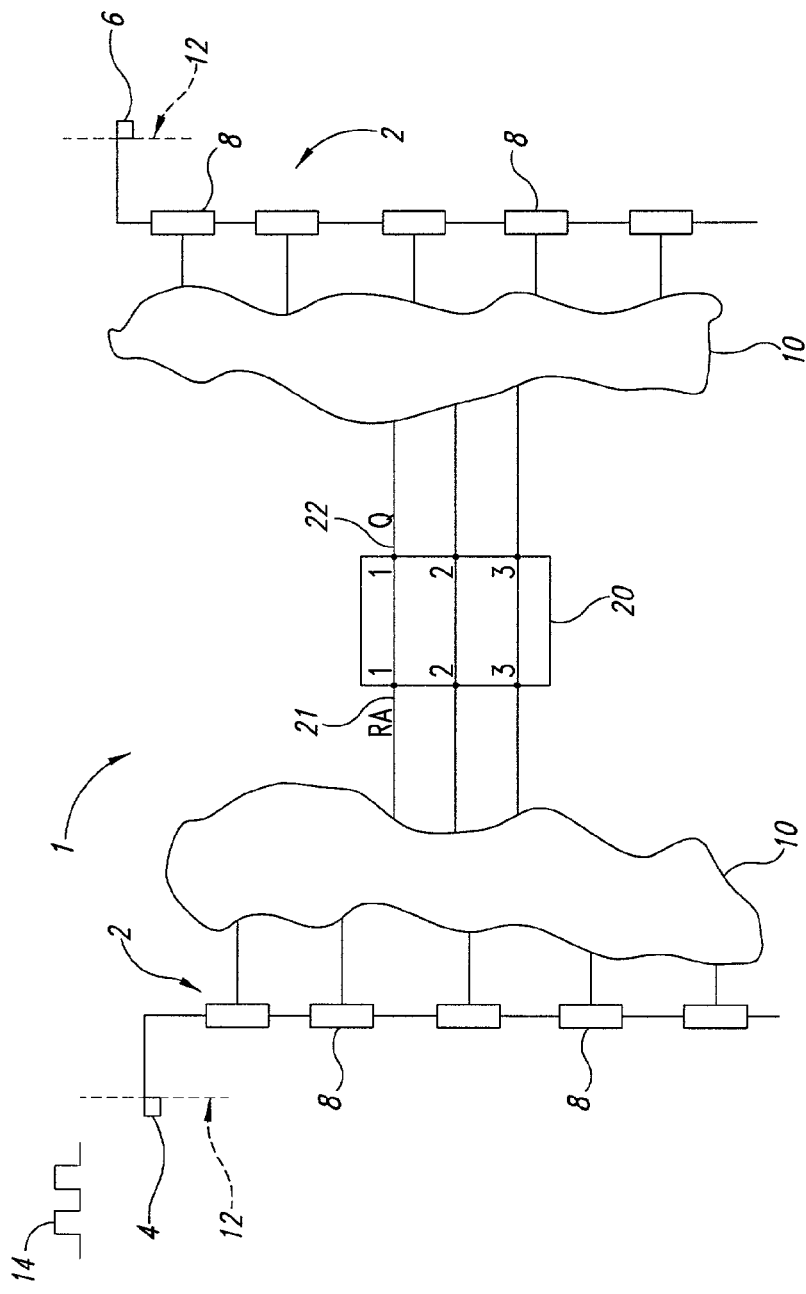
FIG. 3 shows a scan chain within an integrated circuit which includes a memory.

The scan chain arrangement of FIG. 3 comprises scan chains 2 receiving input signals 14 via respective input pins 4 as before. The scan chains are within logic circuitry of a chip 1 defined by a chip boundary 12. As before, each scan chain comprises a sequence of flip flops 8 which shift a bit sequence, or test pattern, from the input pin 4 to an output pin 6. Now in addition to combinational logic components represented by logic blocks 10, a memory 20 forms part of the circuit 1.

Figure 4:
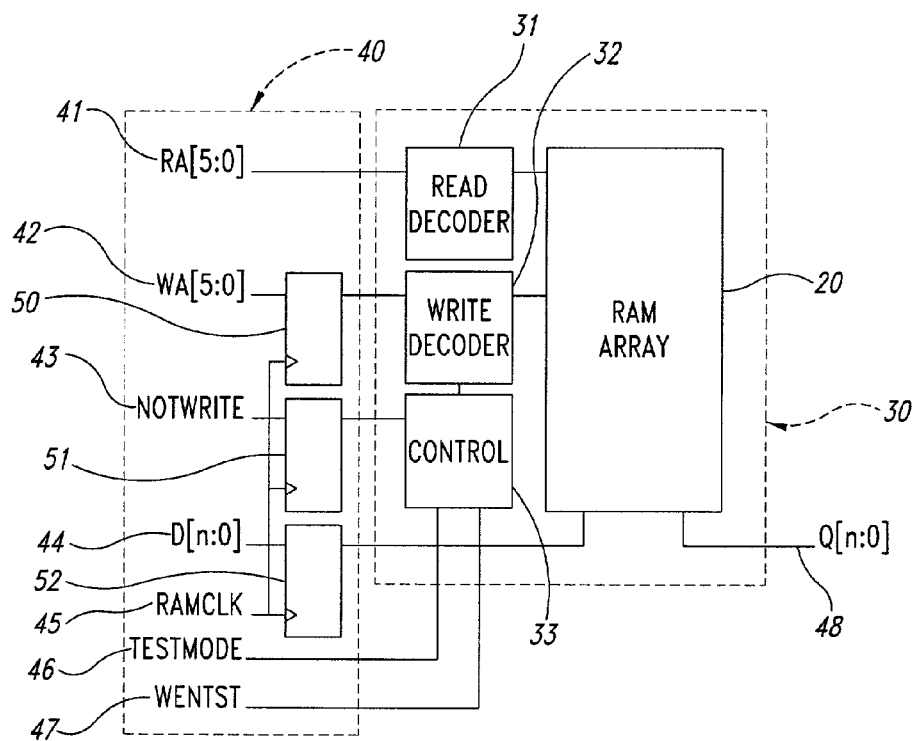
FIG. 4 shows the overall circuit of a memory embodying the invention.

The memory 20 has a read address port (RA) 21 and an output port (Q) 22. The memory output is determined by the selected address and the contents at that address. However, in normal operation, at any given time, the memory contents may not be known. Accordingly, when testing using ATPG, the memory's data outputs may be undefined for any selected address, and the memory may therefore behave as a blockage. This will mean that logic up to and including the address inputs may be unobservable, and logic from the data outputs onwards may be uncontrollable. To avoid this problem, a wrapper circuit having control logic is provided to write known data patterns to the RAM 20 prior to testing the whole integrated circuit 1, as shown in FIG. 4.

The integrated circuit embodying the invention comprises a core 30 and a wrapper 40. The core comprises a RAM array 20, the contents of which are to be configured prior to testing, and read decoder 31, write decoder 32 and control 33 for interfacing the RAM array 20 to the wrapper 40. The wrapper 40 itself is an interface circuit to provide external connection and control of the RAM 20 to allow control prior to running test patterns. The wrapper 40 comprises various ports, and three clocked D type latches 50, 51, 52. A read address port of width 6 bits (RA) 41 provides the addresses for which the contents should be presented at RAM output (Q) 48. The read address port 41 applies the address via read decoder 31. Similarly, a write address port of width 6 bits 42 provides the address to which data should be written in RAM via a write decoder 32. The write address signal (WA) from the write address port 42 is latched through a scan flip-flops 50 under control of a RAM clock signal for write access (RAM CLK) at RAM clock port 45. Similarly, the data (4 to 64 bits) D[n:o] to be written to the address given by the write address signal is presented at a data port 44 and clocked through scan flip-flops 52. The data is then presented direct to the memory 20. The write part is therefore synchronous and advantageously the scan flip-flops allow observability of preceding logic outside the RAM. The read port, on the other hand, is asynchronous and so passes data through it in the same clock cycle, making it suitable for combinational ATPG test patterns.

It is noted at this point that no additional components are required in the read address (RA) path 41 which advantageously therefore does not affect the timing of read operations.

The memory circuit can have several different configurations, including either random access memory (RAM) or content addressable memory (CAM), and may have sizes from 8 words by 8 bits to 64 words by 128 bits, for example. They all have the same basic architecture: synchronous write, asynchronous read/and or Compare, and level sensitive test write control.

For example:
Dual Port RAM—DPR: 1 write port, 1 read port.
Triple Port RAM—TPR: 1 write port, 2 read port.
Quad Port RAM—QPR: 4 write port, 4 read port.
RAM Cam—RC: 1 write port, 1 read port, 1 compare port.
Quad Port RAM—QPC: 4 write port, 4 compare port These are all different examples of a memory circuit which could benefit from the present invention.

The DPR model can be found in all configurations (up to 64 words×128 Bits).

There are two variants on the basic DPR RAM:
a) Registered read address.
b) Word-Enabled write port.
The TPR model is found in 32×32.
The RC model is found 16×11 and 16×22.
The QPR model is found in 32×32.
The QPC model is found in 32×22.
TPR, DPR and QPR are RAM, whereas RC and QPC are addressable content memory. (However RC is a RAM and a CAM).

Figure 5:
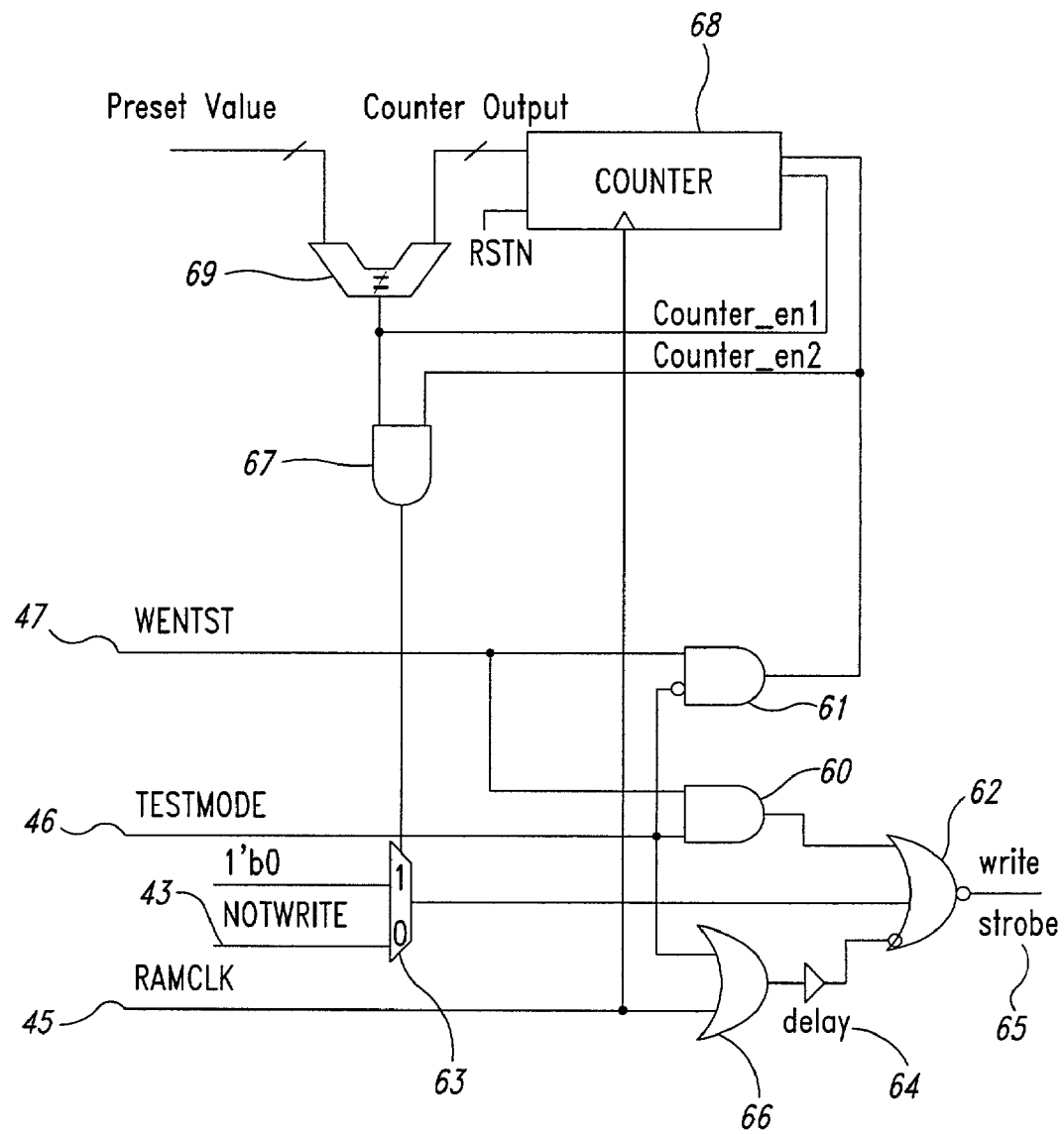
FIG. 5 shows the control logic for the memory of FIG. 4 including preloader circuitry.

The functions of the wrapper circuit 40 to allow the memory to operate in a normal mode, or selectively to fill the memory with a predefined pattern for testing are controlled by a NOT WRITE signal at write enable port 43 (active low), a WENTST signal at test write clock port 47 and a TESTMODE signal at test mode enable port 46. These signals are applied to a control block 33 whose logic functions are shown expanded in FIG. 5.

The TESTMODE signal at port 46 defines whether the memory 20 is set to test mode, and is applied to AND gate 60 along with the WENTST signal at port 47. When the TESTMODE signal is logic '0', the output of AND gate 60 is zero so that NOR gate 62 is not blocked. The TESTMODE signal is also applied to NOR gate 66 which also receives the RAMCLK signal on port 45. The delayed output of NOR gate 66 thus follows the RAMCLK signal with the result that the write strobe input 65 effectively the delayed RAMCLK signal AND'd with an inverted version of the NOT WRITE signal. In this mode, the RAM is in normal operation and data may be written to and read from the memory. When the WENTST signal is set to logic '1', and the TESTMODE signal remains logic '0' the RAM 20 is set to preload mode. The AND gate 61 has output logic '1' which is provided to counter 68 as one counter enable signal and to AND gate 67. The counter 68 is reset to zero by RSTN and is clocked by the RAMCLK signal on port 45; and counts until the counter output reaches a predetermined value, at which point a comparator 69 produces an output signal which disables further incrementing of the counter and connects to AND gate 67. The AND gate 67 controls multiplexer 63, so that a logic '1' is presented from the multiplexer to OR gate 62 so that the write strobe is active for a given number of counts, and then reverts to inactive when the counter 68 and comparator 69 cause the AND gate 67 to switch the multiplexer 63 to the NOTWRITE signal 43 which will normally be logic '1'.

When both TESTMODE and WENTST are set to logic '1', the output 68 of NOR gate 62 is set to logic '0' and the system is in combinatorial ATPG mode with write operations inhibited. Lastly, when the WENTST signal is a clock value, the RAM is in pattern wrapping test mode. This is summarized in the following table:

| TESTMODE | WENTST | Function |
|---|---|---|
| 0 | 0 | Normal Functional Operation |
| 0 | 1 | Preload Ram Array |
| 1 | 1 | Combinational ATPG |
| 1 | Clock | Sequential ATPG (pattern mapping) |

Figures 6, 7:
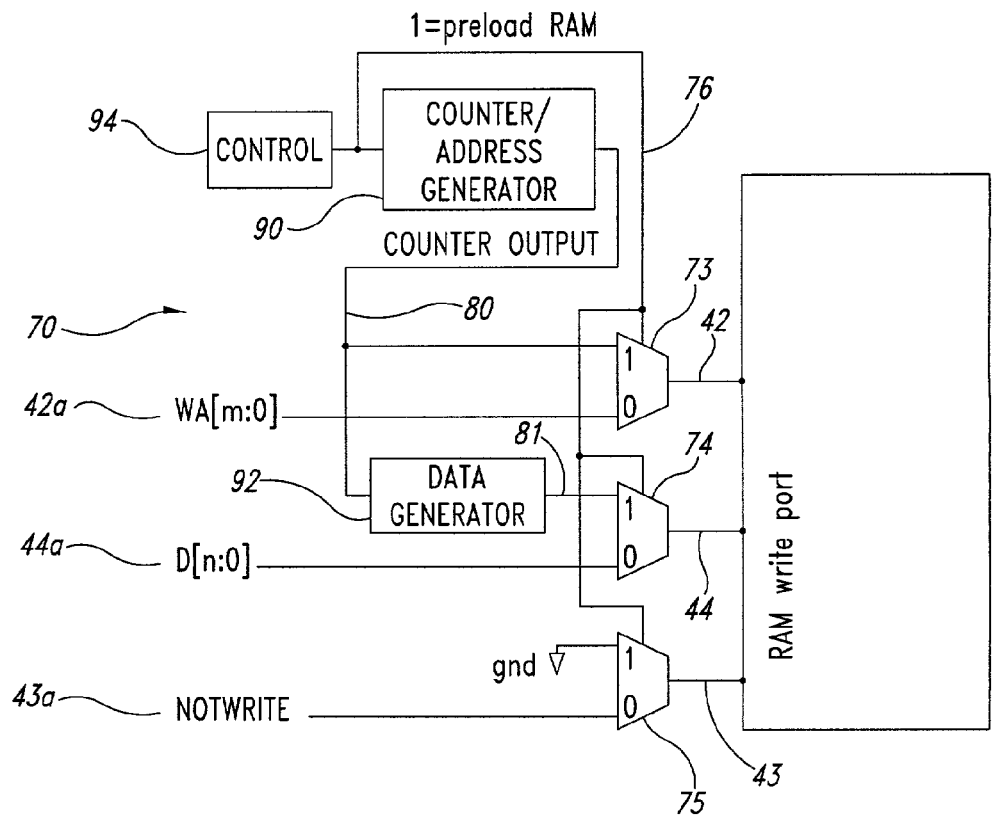
FIG. 6 shows the memory preloader part of the circuit embodying the invention.
FIG. 7 shows a memory pattern for RAM.

To preload the RAM with a predefined pattern, the wrapper circuit 40 includes a preloader having pattern generation and loading logic 70 as shown in FIG. 6. The preloader part of the wrapper circuit 40 comprises the ports interfaces and latches as shown and described in relation to FIG. 5, however, these are not shown for simplicity. Again, it is noted that the wrapper circuit does not introduce any components in the read access (RA) path.

The preloader loading logic 70 comprises a control 94, data generator 92 and address generator 90 and three multiplexers 73, 74, 75. A write address multiplexer 73 multiplexes a write address port 42a with an output line 80 of the address generator 90 to write address port 42. Similarly, a data multiplexer 74 multiplexes the data output 81 of generator 92 with a data input port 44a to data port 44. Lastly, NOT WRITE multiplexer 75 multiplexes a NOT-WRITE port 43a with logic '0'

When a reset is asserted, the counter 68 is reset and the multiplexers 73, 74,75 are switched to receive inputs from address generator 90 and data generator 92 and logic '0' on lines 80, 81,82 by multiplexer control line 76. The data generator 92 and address generator 90 are reset. When the address generator reaches the maximum address of the RAM, the output of the comparator 69 is false and the multiplexers 73, 74,75 switch back so that write access 42a, data 44a and NOTWRITE 43a connect to their respective ports 42, 44, 43. The TESTMODE signal 46 at write enable port 43 is activated when the pattern has been written to the memory. This effectively turns the RAM into a ROM having predictable combinational properties as previously described.

The choice of pattern and data generator configuration depends upon the type and size of memory used. Any pattern in the memory may be re-written as a Boolean expression, which allows the memory to behave as combinatorial logic, however, the more regular the pattern, the more the expression can be simplified.

Figure 8:
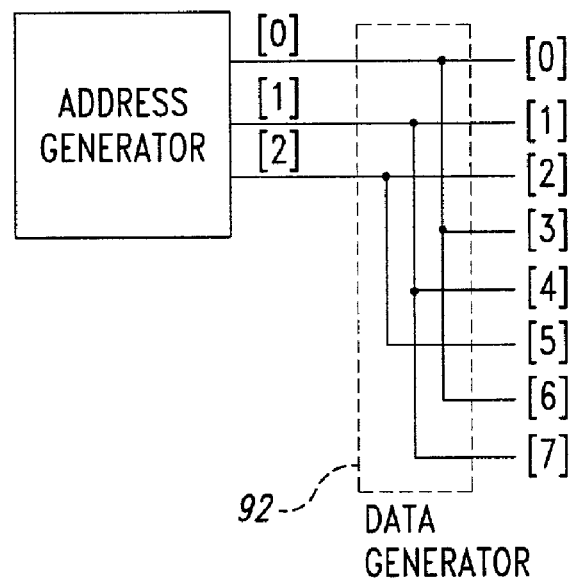
FIG. 8 shows a data generator for the memory pattern of FIG. 7.

The requirements of a pattern to be preloaded in memory are:
a) we can observe a '1' or '0' on any of the read address inputs;
b) we can set a '1' or '0' on any of the read data outputs;
Preferably the pattern is also chosen so that:
c) the pattern can be represented by a simple logic function;
d) the pattern data can easily be generated from the address bit pattern;

The simplest pattern for a RAM is data=address, the pattern being replicated as many times as necessary to fill all the bit positions in the data word. An example pattern is shown in FIG. 8. In this case, the data generator in the preloader is simply wires or other electrical connections so that the data equals the address.

Figure 9:
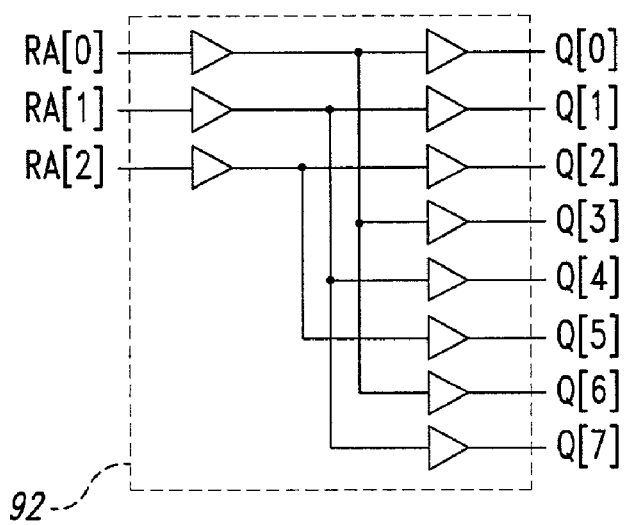
FIG. 9 shows the logic equivalent circuit for a RAM preloaded with the pattern of FIG. 7.
Figure 10:
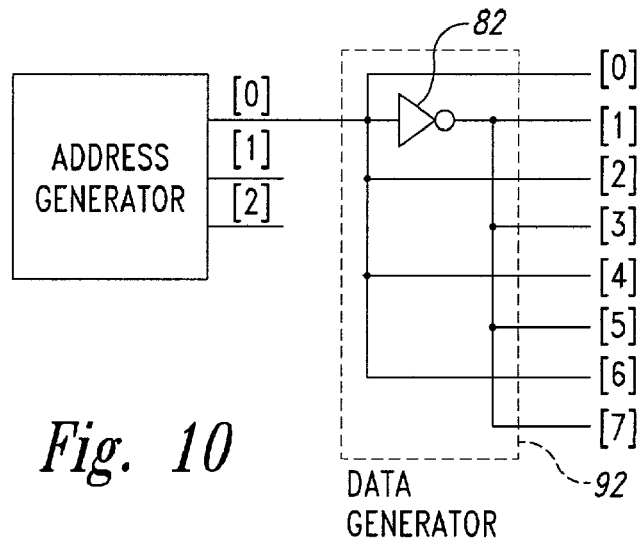
FIG. 10 shows a data generator for CAM.

The data generator to create this pattern is shown in FIG. 9. As can be seen, by selecting such a simple pattern, the data generator is simply a connection from each address bit to a corresponding data bit. The corresponding logic model of the RAM is shown in FIG. 10, and is the same as the data generator except for the addition of buffers 82 at the appropriate locations. This is to ensure that every input and output is independent.

In one embodiment, the pattern generator is comprised of an enabled address counter. The pattern is simply a logical function of the address.

For an 8×16 RAM (or RAM/CAM):

| RA | Q |
|---|---|
| 000 | 0000000000000000 |
| 001 | 1001001001001001 |
| 010 | 0010010010010010 |
| 011 | 1011011011011011 |
| 100 | 1100100100100100 |
| 101 | 1101101101101101 |
| 110 | 0110110110110110 |
| 111 | 1111111111111111 |

For 8 words, there are three address bits RA [0], RA[1], RA[2] producing $2^3$=8 addresses as shown. With the pattern above, these address bits map onto the outputs Q as follows:
RA[0] maps to Q[0], Q[3], Q[6], Q[9], Q[12], Q[15]
RA[1] maps to Q[1], Q[4], Q[7], Q[10], Q[13]
RA[2] maps to Q[2], Q[5], Q[8], Q[11], Q[14]

The real input bit thus produces a deterministic output, which is consistent for each test.

For a 8×16 RAM/CAM:
C[15:0]==0000000000000000 maps to M[7:0]=00000001
C[15:0]==1001001001001001 maps to M[7:0]=00000010
C[15:0]==0010010010010010 maps to M[7:0]=00000100
C[15:0]==1011011011011011 maps to M[7:0]=00001000
C[15:0]==0100100100100000 maps to M[7:0]=00010000
C[15:0]==1101101101101101 maps to M[7:0]=00100000
C[15:0]==0110110110110110 maps to M[7:0]=01000000
C[15:0]==1111111111111111 maps to M[7:0]=10000000
C[15:0]==anything else maps to M[7:0]=00000000

Figure 11:
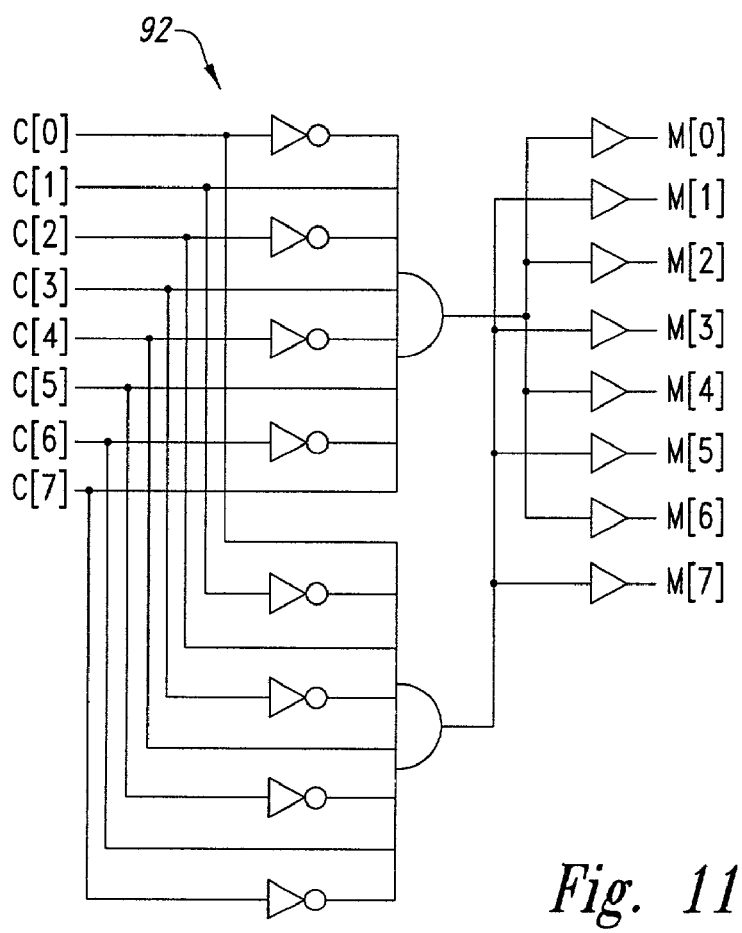
FIG. 11 shows the logic equivalent circuit for a preloaded CAM.

For a CAM, the data=address pattern will only allow one output bit to be set high at a time. A checker board pattern is preferred instead, the logic function being represented by inverters, buffers and two multi input AND gates. One embodiment of such a data generator is shown in FIG. 11 and comprises an inverter and interconnections so that a sequence of repeating 1's and 0's is presented at the memory data input. The logic function the loaded memory represents is shown on FIG. 12 for an 8×8 CAM.

The pattern for the CAMS is the well known checkerboard and inverse checkerboard, used respectively for even and odd addresses.

For an 8×16 CAM:
0101010101010101
1010101010101010
0101010101010101
1010101010101010
0101010101010101
1010101010101010
0101010101010101
1010101010101010

This means that:

C[15:0]==0101010101010101 maps to M[7:0] =01010101

C[15:0]==1010101010101010 maps to M[7:0] =10101010

C[15:0]==anything else maps to M7:0]=00000000

The problem addressed by the embodiment was that generally GBUsoftrams are too small and numerous to use Built in Self Test (BIST) technology, but that during combinational ATPG, the GBU RAMS are treated as "black boxes" (or X generators because ATPG tools don't know how to deal with memories in combinational mode) which means that fault coverage is lost by propagating unknown values. That is, Logic in the RAM's control path is unobservable, and logic in the observe path is uncontrollable, the write logic, is observable because the write port is scanned.

As described, the wrapper initializes the memory contents with a known pattern on each memory location, which will make the RAM deterministic and rendered in the ATPG model as a collection of combinational gates and not a memory model.

Figure 12:
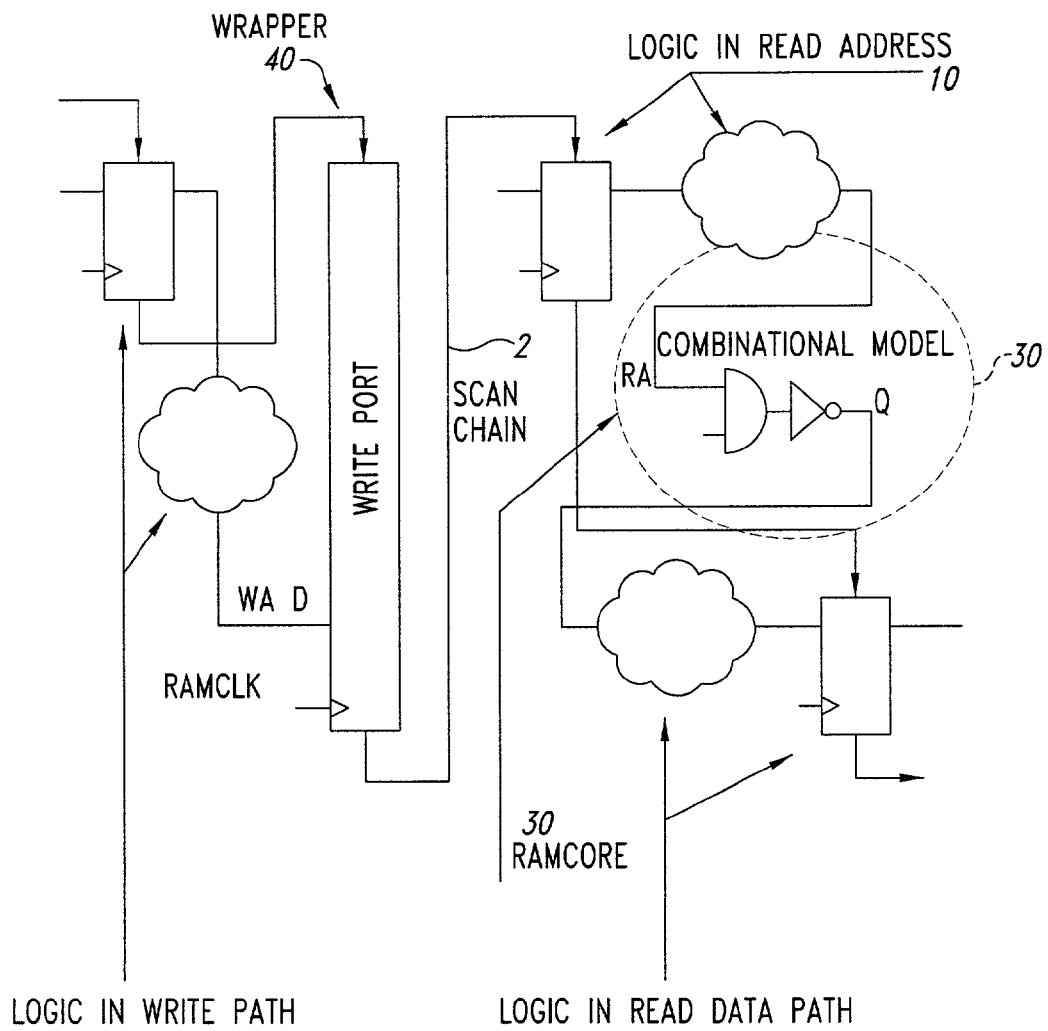
FIG. 12 shows the overall view of a testing arrangement with preloaded memory.

The overall view of testing with a preloaded memory is shown in FIG. 12. Namely, an example of an entire system using the present invention is provided. Logic 10 in the input write path is shown, after which is positioned the wrapper 40. According to the invention the wrapper 40 connects to and interacts with the memory core 30 in the manner explained. Additional logic 10 may exist in the read address path and also in the read data path as shown.

This improves fault coverage during combinational ATPG, uses a low silicon area, is a simpler ATPG Model. Also, the wrapper circuit uses flip flops which are scanable.

Using the wrapper to write in the memory exercises the read and write decode logic. Therefore the algorithm applies during pattern mapping (macrotest) can be simplified from 6N to 4N. This brings a significant decrease in the number of Macrotest/Pattern Mapping vectors. This results in test time reduction especially if the number of flip-flops per scan chain is high.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A semiconductor integrated circuit comprising a plurality of combinational logic components, a memory and a testing arrangement to configure the memory prior to testing the combinational logic components using one or more scan chains, the testing arrangement comprising:
   a data generator internal to the integrated circuit to generate a selected bit pattern to write to the memory;
   a switching arrangement to selectively switch the memory input to receive data from the combinational logic components or from the data generator, wherein the switching arrangement and data generator are arranged for the data generator to input the selected bit pattern to the memory prior to testing the combinational logic components of the integrated circuit; and
   a testing circuit to test the combinational logic components, using a test pattern, after the data generator has input the selected bit pattern to the memory, wherein the testing arrangement includes a wrapper circuit and includes a control to selectively control the memory to output a predictable output if the test pattern is supplied to the combinational logic components after writing the selected bit pattern to the memory, wherein the combinational logic components and memory remain connected while testing the integrated circuit using the test pattern.

2. The semiconductor integrated circuit according to claim 1 wherein the testing arrangement further comprises an enable input, the enable input being arranged to prevent writing to the memory after writing the selected bit pattern to the memory.

3. The semiconductor integrated circuit according to claim 1 wherein the selected bit pattern for a given address comprises a function of an address bit sequence, and wherein the data generator is arranged to present the selected bit pattern at outputs corresponding to address inputs of the memory.

4. The semiconductor integrated circuit according to claim 1 wherein the testing arrangement further comprises an arrangement of multiplexers to selectively connect the memory to the combinational logic components of the integrated circuit, or to the data generator.

5. The semiconductor integrated circuit according to claim 1 wherein the testing arrangement further comprises an address generator to generate addresses of the memory to which the selected bit pattern is to be written, the data generator comprising an array of interconnections to transfer the address bit sequence from the address generator to a data input of the memory.

6. The semiconductor integrated circuit according to claim 1 wherein the selected bit pattern is a checkerboard pattern in the memory.

7. The semiconductor integrated circuit according to claim 1 wherein the selected bit pattern written in the memory is arranged so that the memory may be modeled as a simple combinational circuit with the predictable output.

8. The semiconductor integrated circuit according to claim 1 wherein the wrapper circuit of the testing arrangement is configured to selectively preload the memory, or to connect the memory to other components in the integrated circuit.

9. A semiconductor circuit, comprising:
   a memory array;
   a plurality of logic elements selectively coupled to the memory array;
   a data generator selectively coupled to the memory array to generate a selected bit pattern to write to the memory array;
   a switching circuit to selectively couple the logic elements or the data generator to input data into the memory array at a selected time under control of a control circuit; and
   a logic testing circuit coupled to the logic elements configured to test the operation of the logic elements based on a test bit pattern that is input to the logic elements and that is different from the selected bit pattern present in the memory array, wherein the logic elements and the memory array remain actively coupled to each other during the test of the operation of the logic elements.

10. The semiconductor circuit according to claim 9 wherein said switching circuit includes a multiplexer having one input coupled to the logic elements and another input coupled to the data generator and a control input coupled to the control circuitry to selectively connect the memory array to the logic elements during the test of the operation of the logic elements or to the data generator.

11. The semiconductor circuit according to claim 9 wherein said data generator creates the selected bit pattern to load into the memory array prior to test of the semiconductor circuit.

12. The semiconductor circuit according to claim 11 wherein the selected bit pattern which is selected for a given address in the memory array is a function of an address bit sequence.

13. The semiconductor circuit according to claim 12 further comprising:
an address generator to generate addresses of the memory array to which the bit pattern is to be written and the data generator includes an array of inner connections to transfer the address bit sequence from the address generator to a data input of the memory array.

14. The semiconductor circuit according to claim 12 in which the selected bit pattern which is written to the memory array is selected based on a type of memory to which the selected bit pattern is to be written.

15. The semiconductor circuit according to claim 14 wherein the memory array is a RAM.

16. The semiconductor circuit according to claim 14 wherein the memory array is a CAM.

17. The semiconductor circuit according to claim 9 in which the time selected for coupling the data generator to the memory array is prior to the test of the operation of the logic elements so that the selected bit pattern is input by the data generator into the semiconductor circuit prior to the test of the operation of the logic elements.

18. The semiconductor circuit according to claim 9 wherein the control circuit selects a time to control input provided to the memory array and further including a memory array enable circuit to enable the input of data to the memory array prior to the test of the operation of the logic elements and to disable data input into the memory array after the selected bit pattern has been written to the memory array and during the test of the operation of the logic elements, such that during the test of the operation of the logic elements, the memory array having an output that is usable during the test of the operation of the logic elements.

19. A method of testing logic in a same integrated circuit as a semiconductor integrated memory circuit, the method comprising:
switching a memory input with a multiplexer to receive address, data, and control signals, in a first state, from an external interface or, in a second state, from an internal address counter, an internal data generator and an internal test control circuit;
during the second state:
generating an address with the internal address counter for determining an address at which data will be written;
coupling an output of the internal address counter with an input of the internal data generator;
generating a first bit pattern with the internal data generator based upon a value of the internal address counter;
writing the first bit pattern into a memory at the address specified by the internal address counter; and
inputting a second bit pattern, different from the first bit pattern, into the logic to be tested after writing the first bit pattern into the memory; and
testing the logic using the second bit pattern, wherein an output of the memory is predictable based on the first bit pattern written therein and is independent of the second bit pattern, said testing the logic including keeping the memory actively coupled to the logic during the testing of the logic to allow the output of the memory to be used during the testing of the logic.

20. The method of testing logic in the same integrated circuit as the semiconductor integrated memory circuit according to claim 19, wherein the first bit pattern to be generated comprises a checkerboard pattern.

21. The method of testing logic in the same integrated circuit as the semiconductor integrated memory circuit according to claim 20, wherein the memory comprises a Content Addressable Memory.

22. The method of claim 19 wherein testing the logic using the second bit pattern, wherein the output of the memory is predictable based on the first bit pattern written therein includes placing the memory in a state that simulates a combinatorial logic function.

23. A method of testing logic elements that are in a same integrated circuit as a memory array, the method comprising:
inputting to the memory array a first pattern of data bits, the first pattern being selected to configure the memory array to operate as a combinatorial logic circuit;
setting the integrated circuit in logic test mode for testing logic that is outside of the memory array;
inputting to the memory array a first pattern of data bits, the first pattern being selected to configure the memory array to output a predictable output;
receiving said predictable output from the memory array during the testing of the logic, the output of the memory array being predictable based on the first bit pattern and being independent of the second bit pattern input to the logic for the testing of the logic.

24. The method according to claim 23 further including:
sending signals via a scan chain between respective logic elements of the logic being tested.

* * * * *